United States Patent
Chen

(10) Patent No.: US 7,443,253 B2
(45) Date of Patent: Oct. 28, 2008

(54) DETECTION DEVICE FOR DETECTING OSCILLATOR

(75) Inventor: Ming-Kun Chen, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 80 days.

(21) Appl. No.: 11/309,603

(22) Filed: Aug. 30, 2006

(65) Prior Publication Data

US 2007/0188252 A1     Aug. 16, 2007

(30) Foreign Application Priority Data

Feb. 13, 2006    (TW) .............................. 95104696 A

(51) Int. Cl.
*H03B 1/00* (2006.01)

(52) U.S. Cl. .............................. 331/74; 331/44; 331/64; 327/113; 324/76.39

(58) Field of Classification Search .................... 331/64, 331/44, 74, 62, 111, 143, 144, 145, 153; 324/76.39, 76.49, 76.51; 327/111, 143, 144, 327/145, 153, 113

See application file for complete search history.

(56) References Cited

U.S. PATENT DOCUMENTS

| 5,214,228 A | * | 5/1993 | Hoiles et al. ............... 84/470 R |
| 2004/0160282 A1 | * | 8/2004 | Kim ............................. 331/57 |

FOREIGN PATENT DOCUMENTS

| JP | 56155868 A | * | 12/1981 |
| JP | 62247276 A | * | 10/1987 |

* cited by examiner

*Primary Examiner*—Robert J. Pascal
*Assistant Examiner*—Ryan J. Johnson
(74) *Attorney, Agent, or Firm*—Jianq Chyun IP Office

(57) ABSTRACT

A detection device for detecting an oscillator is provided. The detection device includes an oscillator control circuit, a frequency-decreasing circuit and a display circuit. The oscillator control circuit is used for outputting the oscillator signal of the oscillator. The frequency-decreasing circuit is connected to the output of the oscillator control circuit and has a capacitor suitable for charging and discharging and a resistor, which can adjust the time constant of the oscillator signal. The display circuit is connected to the frequency-decreasing circuit for showing the output signal of the frequency-decreasing circuit. The detection device can decide whether the oscillator is normal or broken by observing a component of the display circuit, for example, the twinkling of a light emitting diode of the display circuit.

9 Claims, 2 Drawing Sheets

US 7,443,253 B2

DETECTION DEVICE FOR DETECTING OSCILLATOR

CROSS-REFERENCE TO RELATED APPLICATION

This application claims the priority benefit of Taiwan application serial no. 95104696, filed on Feb. 13, 2006. All disclosure of the Taiwan application is incorporated herein by reference.

BACKGROUND OF THE INVENTION

1. Field of the Invention

The present invention relates to a detection device, and more particularly, to a detection device for detecting an oscillator.

2. Description of Related Art

FIG. 1 is a flow diagram of a conventional method of measuring a quartz oscillator. As shown in FIG. 1, in the conventional method of measuring the oscillation of a quartz oscillator, the quartz oscillator to be tested is placed on a detection station in step S110. Then, in step S120, power supply and oscilloscope are connected to the quartz oscillator. After that, in step S130, the power supply outputs power signal to the quartz crystal to be tested. Next, in step S140, the oscilloscope is adjusted. Finally, in step S150, the waveform captured by the oscilloscope is observed to determine if the quartz oscillator under testing meets the standard specification.

Although the use of a power supply and an oscilloscope to screen out any faulty oscillator can be very accurate, the price of the power supply and oscilloscope is not low. As a result, the conventional technique of detecting the performance of the oscillator often costs too much. Therefore, a detection device capable of accurately detecting fault in any oscillator at a lower cost will be in great demand.

SUMMARY OF THE INVENTION

Accordingly, at least one objective of the present invention is to provide a detection device capable of effectively and conveniently detecting fault in any oscillator without using costly instruments such as an oscilloscope and power supply. Furthermore, the detection device in the present invention has the special characteristics of being light and not occupying too much space so that it is convenient to be used and carried around.

To achieve these and other advantages and in accordance with the purpose of the invention, as embodied and broadly described herein, the invention provides a detection device for detecting an oscillator. The detection device includes an oscillator control circuit, a frequency-decreasing circuit and a display circuit. The oscillator control circuit is used for outputting the oscillator signal of the oscillator. The frequency-decreasing circuit is connected to the output of the oscillator control circuit and has a capacitor suitable for charging and discharging and a resistor, which can adjust the time constant of the oscillator signal. The display circuit is connected to the frequency-decreasing circuit for showing the output signal of the frequency-decreasing circuit.

In one embodiment of the present invention, the oscillator control circuit has a NOR gate, one of the input terminals of the NOR gate connected to the oscillator and another of the input terminals of the NOR gate connected to a reference voltage source. Furthermore, the detection device also includes a switch connecting between the reference voltage source and a ground terminal. Moreover, the frequency-decreasing circuit has a first NOR gate and a second NOR gate. The capacitor is connected between the output terminal of the first NOR gate and the input terminal of the second NOR gate, and the resistor serially connects the reference voltage source to the capacitor. In addition, the output terminal of the second NOR gate is feedback connected to one of the input terminals of the first NOR gate and another of the input terminals of the first NOR gate is connected to the output terminal of the oscillator control circuit.

In one embodiment of the present invention, the frequency-decreasing circuit further includes a protective device serially connected between the capacitor and the reference voltage source. The protective device can be a diode. Furthermore, the detection device may include a frequency division circuit and a power converter. The frequency division circuit is connected between the display unit and the frequency-decreasing circuit. The power converter is connected to the oscillator control circuit, the frequency-decreasing circuit and the display circuit to output the reference voltage. In the meantime, the display circuit has a light emitting diode. The cathode of the light emitting diode is connected to the output terminal of the frequency division circuit and the anode of the light emitting diode is connected to the reference voltage source.

Accordingly, the detection device of the present invention inputs the oscillation signal from the oscillator control circuit to the frequency division circuit and the frequency-decreasing circuit and the resulting signal are used to drive the light emitting diode. Hence, by taking a visual observation of the brightness of the light emitting diode, an inspector can easily determine whether an oscillator is normal or broken.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
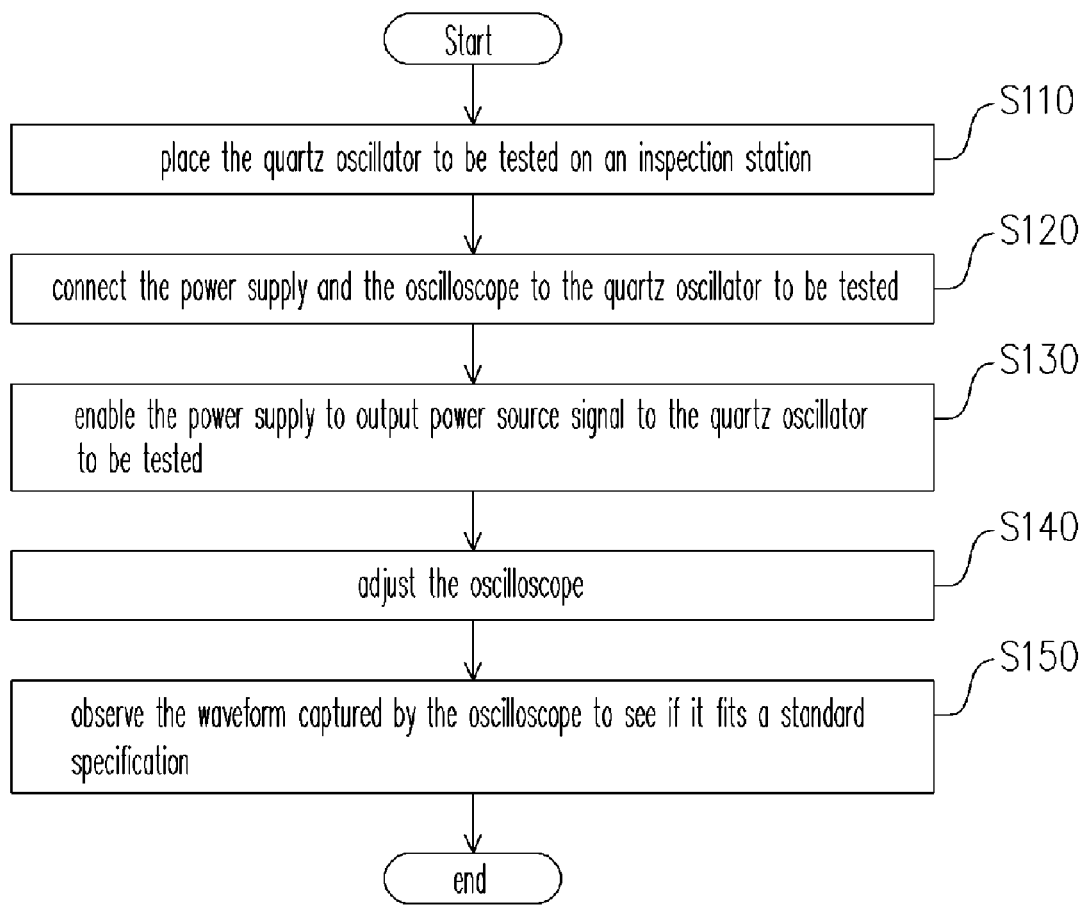
FIG. 1 is a flow diagram of a conventional method of measuring a quartz oscillator.

Reference will now be made in detail to the present preferred embodiments of the invention, examples of which are illustrated in the accompanying drawings. Wherever possible, the same reference numbers are used in the drawings and the description to refer to the same or like parts.

Figure 2:
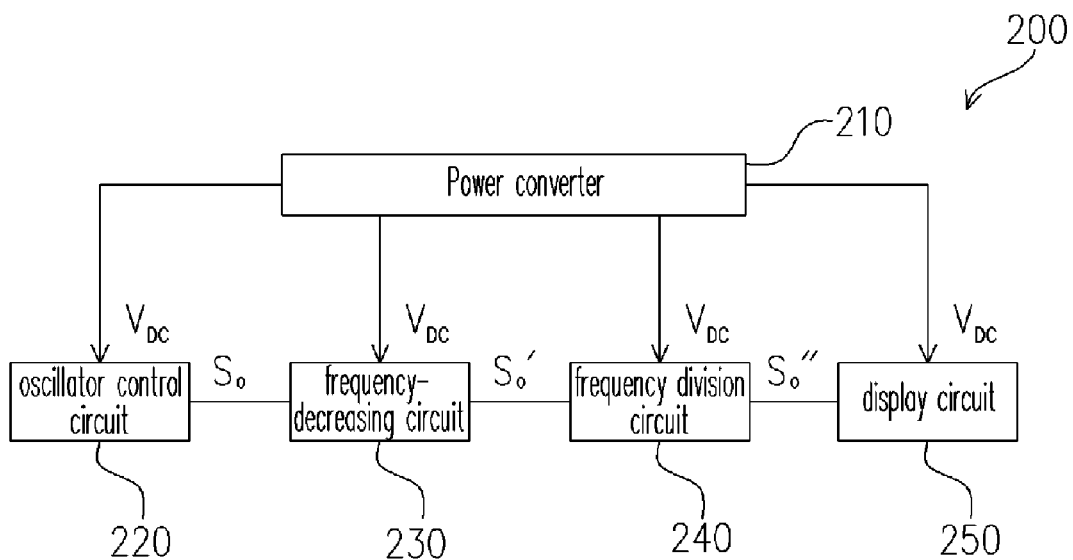
FIG. 2 is a block diagram showing the circuit of a detection device according to one embodiment of the present invention.

FIG. 2 is a block diagram showing the circuit of a detection device according to one embodiment of the present invention. As shown in FIG. 2, the detection device 200 in the present invention includes a power converter 210, an oscillator control circuit 220, a frequency-decreasing circuit 230, a frequency division circuit 240 and a display circuit 250. The power converter 210 provides a reference voltage $V_{DC}$ to the oscillator control circuit 220, the frequency-decreasing circuit 230, the frequency division circuit 240 and the display circuit 250. The oscillator control circuit 220 is used for outputting an oscillation signal $S_0$ to the oscillator 124 (shown in FIG. 3A) under testing. Furthermore, the frequency-decreasing circuit 230 is connected to the output terminal of the oscillator control circuit 220 for receiving the oscillation signal $S_0$ and lowering its frequency to produce another oscillation signal $S_0'$. The frequency division circuit 240 is connected between the frequency-reducing circuit 230 and the display circuit 250 for receiving the oscillation signal S0' and dividing the frequency to produce another oscillation signal $S_0''$. The display circuit 250 is connected to the frequency division circuit 240 for receiving the oscillation signal $S_0''$ and displaying a circuit action that corresponds to the oscillation signal $S_0''$, for example, twinkling the light emitting diode.

On the other hand, if the frequency lowering capacity of the frequency-decreasing circuit 230 is able to meet the requirement of detection, the frequency division circuit 240 can be eliminated. In other words, the display circuit 250 is connected to the frequency-decreasing circuit 230 for directly receiving the oscillation signal $S_0'$ and displaying the circuit action that corresponds to the oscillation signal $S_0'$.

Figure 3A:
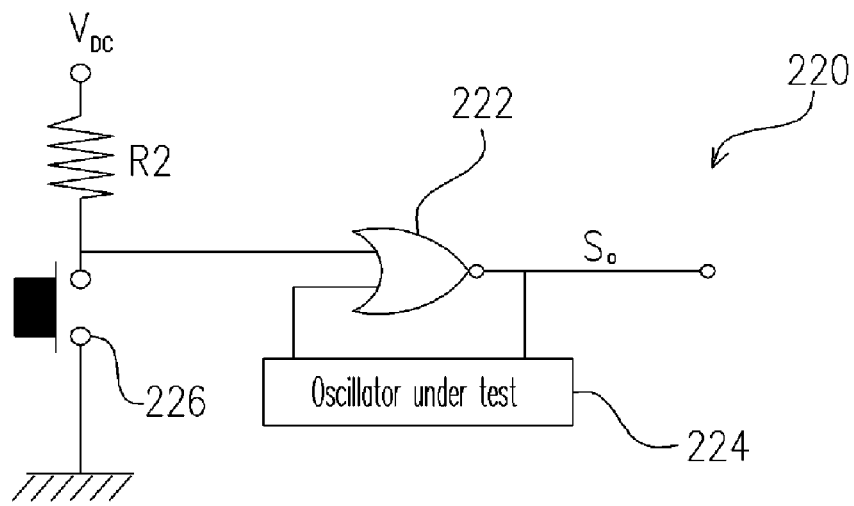
FIG. 3A is a circuit diagram of an oscillator control circuit according to one embodiment of the present invention.

FIG. 3A is a circuit diagram of an oscillator control circuit according to one embodiment of the present invention. As shown in FIGS. 2 and 3A, the oscillator control circuit 220 has a NOR gate 222. One of the input terminals of the NOR gate 222 is connected to an oscillator 224 under test and another of the input terminals of the NOR gate 222 is connected to the power converter 210 through a resistor R2 for receiving the reference voltage $V_{DC}$. The oscillator control circuit 220 outputs an oscillation frequency $S_0$. The oscillation frequency is equivalent to that of the oscillator 224 to be tested. Furthermore, the detection device 200 also includes a switch 226 connected between the resistor R2 and a ground terminal.

As everyone knows, the NOR gate 222 only outputs a high logic level when the both input signals are at a low logic level. When the switch 226 is pushed, the input terminal of the NOR gate 222 connected to the resistor R2 is at a low logic level. Therefore, when the oscillation waveform generated by the oscillator 224 under test drops below the low logic level, the NOR gate 222 will output an oscillation signal $S_0$ at a high logic level. Conversely, when the oscillation waveform generated by the oscillator 224 under test rises above the high logic level, the NOR gate 222 will output an oscillation signal $S_0$ at a low logic level.

Figure 3B:
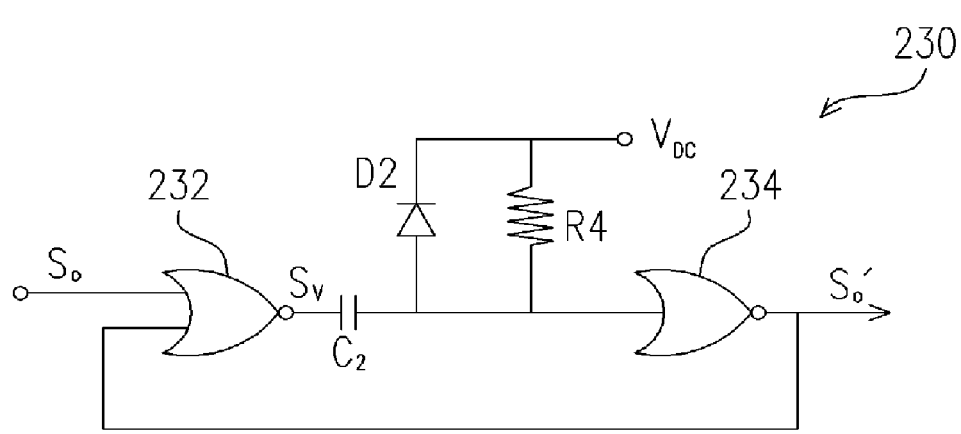
FIG. 3B is a circuit diagram of a frequency-decreasing circuit according to one embodiment of the present invention.

FIG. 3B is a circuit diagram of a frequency-decreasing circuit according to one embodiment of the present invention. As shown in FIGS. 2 and 3B, the frequency-decreasing circuit 230 can reduce the oscillation signal $S_0$ to the oscillation signal $S_0'$. Furthermore, the frequency-decreasing circuit 230 has a capacitor C2 suitable for charging and discharging and a resistor R4. The capacitor/resistor pair is used for adjusting the time constant of the oscillation signal $S_0$. In addition, the frequency-decreasing circuit 230 has NOR gates 232 and 234. The capacitor C2 is connected between the output terminal of the NOR gate 232 and the input terminal of the NOR gate 234. In the meantime, the resistor R4 is serially connected the reference voltage of the power converter 110 to the capacitor C2. Furthermore, the output terminal of the NOR gate 234 is feedback-connected to one of the input terminals of the NOR gate 232 and the other input terminal of the NOR gate 232 is connected to the output terminal of the oscillator control circuit 220. In one embodiment of the present invention, the frequency-decreasing circuit 230 may further include a protective device serially connected between the capacitor C2 and the power converter 210, and the protective device can be a diode D2, for example.

More specifically, after the NOR gate 132 has reduced the frequency of the oscillation signal $S_0$, a signal $S_v$ between the high and low logic level is output. The signal $S_v$ can determine the charge and discharge states of the capacitor C2. Furthermore, the product of the capacitor C2 and the resistor R4 can determine the frequency of the oscillation signal $S_0'$ output by the NOR gate 232. In general, the larger the product of the capacitor C2 and the resistor R4, the smaller will be the frequency of the oscillation signal $S_0'$. Conversely, the smaller the product of the capacitor C2 and the resistor R4, the larger will be the frequency of the oscillation signal $S_0'$. In addition, the diode D2 is used for protecting the frequency-decreasing circuit 230 against possible interference and damage when the power converter 210 outputs an impulse.

If the foregoing frequency-decreasing circuit 230 has insufficient capacity to reduce the frequency, an additional frequency division circuit 240 is to divide the oscillation frequency $S_0'$. For example, the oscillation frequency $S_0'$ can be divided by two and the resulting oscillation frequency $S_0''$ is output to the display circuit 250.

Figure 3C:
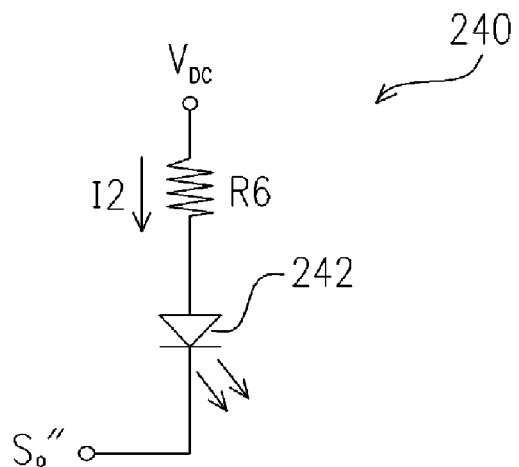
FIG. 3C is a circuit diagram of a display circuit according to one embodiment of the present invention.

FIG. 3C is a circuit diagram of a display circuit according to one embodiment of the present invention. As shown in FIGS. 2 and 3C, the display circuit 250 has a light emitting diode 242. The cathode of the light emitting diode 242 is connected to the oscillation signal $S_0''$ output from the frequency division circuit 240 and the anode of the light emitting diode 242 is connected to the power converter 210 through a resistor R6. More specifically, when the oscillation signal $S_0''$ is below the voltage of the reference voltage $V_{DC}$, a current I2 passes through the light emitting diode 242 so that the light emitting diode 242 lights up. On the other hand, when the oscillation signal $S_0''$ is above the voltage of the reference voltage $V_{DC}$, no current passes through the light emitting diode 242 so that the light emitting diode 242 remains unlit. Because the oscillation signal $S_0''$ is a series of alternating high and low logic levels, the light emitting diode 242 reflects the voltage variation of the oscillation signal $S_0''$ and appears to twinkle. By looking at the twinkling light emitting diode 242, an inspector can determine if the oscillator 224 under test as shown in FIG. 3A is normal or broken.

In summary, as shown in FIG. 2, the detection device 200 in the present invention utilizes the frequency-decreasing circuit 230 and the frequency division circuit 240 to lower the frequency of the oscillation signal $S_0$ produced by the oscillator control circuit 220. Then, the resulting frequency-reduced oscillation signal $S_0''$ is transmitted to the light emitting diode 242 so that the light emitting diode 242 can generate a visually identifiable twinkle to determine whether the oscillator 224 under test is normal or broken. For example, if the original oscillation signal $S_0$ generated by the oscillator control circuit 220 is 4 MHz, the frequency of the signal transmitted to the light emitting diode 242 after passing through the frequency-decreasing circuit 230 and the frequency division circuit 240 is 13 Hz. At a low frequency of 13 Hz, an inspector can easily determine if the oscillator 224 under test is normal by naked eye observation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A detection device for detecting an oscillator, comprising:
   an oscillator control circuit for outputting an oscillation signal of the oscillator;
   a frequency-decreasing circuit, connected to an output of the oscillator control circuit, wherein the frequency-decreasing circuit has a capacitor suitable for charging and discharging and a resistor both for adjusting the time constant of the oscillation signal, the frequency-decreasing circuit has a first NOR gate and a second NOR gate, the capacitor is connected between an output terminal of the first NOR gate and an input terminal of the second NOR gate, and the resistor serially connects a reference voltage source to the capacitor; and
   a display circuit, connected to the frequency-decreasing circuit for displaying an output signal of the frequency-decreasing circuit.

2. The detection device of claim 1, wherein the oscillator control circuit has a NOR gate, and one of input terminals of the NOR gate is connected to the oscillator and the other of the input terminals of the NOR gate is connected to the reference voltage source.

3. The detection device of claim 2, further comprising a switch connected between the reference voltage source and a ground terminal.

4. The detection device of claim 1, wherein an output terminal of the second NOR gate is feedback-connected to one of input terminals of the first NOR gate, and the other input terminal of the first NOR gate is connected to the output of the oscillator control circuit.

5. The detection device of claim 1, wherein the frequency-decreasing circuit further comprises a protection device serially connected between the capacitor and the reference voltage source.

6. The detection device of claim 5, wherein the protection device is a diode.

7. The detection device of claim 1, further comprising a frequency division circuit connected between the display unit and the frequency-decreasing circuit.

8. The detection device of claim 7, wherein the display circuit has a light emitting diode, and a cathode of the light emitting diode is connected to an output of the frequency division circuit and an anode of the light emitting diode is connected to the reference voltage source.

9. The detection device of claim 1, further comprising a power converter connected to the oscillator control circuit, the frequency-decreasing circuit and the display circuit for outputting the reference voltage.

* * * * *